US006337267B1

(12) United States Patent
Yang

(10) Patent No.: US 6,337,267 B1
(45) Date of Patent: Jan. 8, 2002

(54) METHOD FOR FABRICATING A SEMICONDUCTOR MEMORY DEVICE AND THE STRUCTURE THEREOF

(75) Inventor: Won-Suk Yang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/347,821

(22) Filed: Jul. 2, 1999

(30) Foreign Application Priority Data

Jul. 2, 1998 (KR) .......................................... 98-26585

(51) Int. Cl.[7] .................. H01L 21/8242; H01L 21/4763
(52) U.S. Cl. ...................... 438/618; 438/666; 438/637; 438/638; 438/639; 438/640; 438/254
(58) Field of Search ................................. 438/253, 396, 438/618, 634, 638, 666, 255, 397, 254, 703, 720, 723, 754, 756, 622, 624, 625, 637, 639, 640

(56) References Cited

U.S. PATENT DOCUMENTS

| 5,902,126 A | * | 5/1999 | Hong et al. ................. 438/396 |
| 5,920,790 A | * | 7/1999 | Wetzel et al. ................ 438/618 |
| 6,143,640 A | * | 11/2000 | Cronin et al. ................ 438/618 |
| 6,159,820 A | * | 12/2000 | Byung-Jung ................ 438/396 |
| 6,168,992 B1 | * | 1/2001 | Lee ............................... 438/256 |
| 6,214,727 B1 | * | 4/2001 | Parekh ......................... 438/666 |
| 6,235,623 B1 | * | 5/2001 | Lee ............................... 438/618 |
| 6,235,629 B1 | * | 5/2001 | Takenaka ..................... 438/638 |
| 6,238,971 B1 | * | 5/2001 | Parekh et al. ................ 438/255 |

* cited by examiner

Primary Examiner—Matthew Smith
Assistant Examiner—Chuong A Luu
(74) Attorney, Agent, or Firm—The Law Offices of Eugene M. Lee, PLLC

(57) ABSTRACT

A method for fabricating a semiconductor device, wherein a dual damascene metal line is formed utilising a material layer pattern. The material layer pattern has openings to define contact holes both for metal interconnection in the peripheral region and for storage nodes in the cell array region. The material layer pattern is formed on an insulating layer. A second insulating layer is deposited on the material layer pattern. A groove mask pattern is formed and used as an etch stop while etching the etching is performed at the another insulating layer and stopped at the material layer to form a first opening. Using the material layer pattern, exposed portions of the insulating layer are etched to form a second opening aligned to the first opening and thereby to form a dual damascene opening for a metal line. Metal is deposited in the first and second opening to form dual damascene metal lines.

22 Claims, 13 Drawing Sheets

METHOD FOR FABRICATING A SEMICONDUCTOR MEMORY DEVICE AND THE STRUCTURE THEREOF

FIELD OF THE INVENTION

The present invention relates to a semiconductor device and method for manufacturing same. More particularly, it relates to a semiconductor memory device and a method for fabrication with improved resolution and multilevel interconnections using a damascene technique.

BACKGROUND OF THE INVENTION

As the integration density of integrated circuit devices increases, efforts are being concentrated on improving exposure techniques so as to obtain a fine pattern that keeps pace with high integration density. As a recent trend, the wavelength of exposing light for photolithography is getting shorter and shorter, for example, from g-line (wavelength:436 nm), i-line (wavelength:365 nm) to KrF excimer laser (wavelength:248 nm). More recently, one promising candidate is ArF excimer laser (wavelength:193 nm). Formation of a fine pattern device can allow improved integrated circuit performance and reduced fabrication cost through improved production performance.

Photolithographic resolution for fine pattern formation is proportional to the wavelength of the exposing light and a constant (K1), and inversely proportional to the numerical aperture (NA). The constant K1 is related to the resist quality and the resolution technique used. Based on recently used NA, resist quality and resolution techniques, it is believed that resolution limit is 0.3 microns with i-line and 0.15 microns with KrF. In the case of ArF, it is generally expected that the resolution limit will be 0.10 microns.

The above calculated resolution limits assume optimal conditions. It is difficult, however, to maintain such optimal conditions in practice. Rather, the resolution limit is greatly affected by the process conditions, for example, variable topology of the substrate, in the photoresist layer due to topology and the reflection rate of the patterning material. Furthermore, in practice, other factors affect the resolution limit, for example, alignment margin and the process window (based on such factors as the level of planarization and the aspect ratio).

To overcome the above mentioned factors which affect the resolution limit in practice, the damascene technique has been widely used for metal interconnection. This technique is preferable due to the high reflection rate of metal. Further damascene avoids difficulty in etching a thick metal layer as in the conventional metal interconnection process, which comprises: depositing metal on an insulating layer; forming a photoresist layer; patterning the photoresist layer; and etching the metal layer using the patterned photoresist layer.

A conventional damascene process may comprise the following steps. First, a groove for interconnection is formed in the insulating layer. Copper is buried in the groove by a CVD (chemical vapor deposition) technique or a sputter/reflow technique. Planarization is then carried out to remove copper outside of the groove and thereby to form damascene interconnection.

However, there are some problems with the conventional damascene technique in application to a metal pattern or a contact hole of 0.5 microns or less. Particularly, an already formed contact hole can be enlarged during the formation of groove by the damascene technique. One possible approach to overcome this problem is to form a small size contact hole. However, as the degree of integration density increases, formation of small size contact holes is getting more and more difficult. Another possibility is to form a groove before the formation of the contact hole. This approach requires that the photoresist pattern for the contact hole be formed in the already formed groove. However, it is difficult to form a photoresist pattern in deep and small size grooves.

The present invention is directed to overcoming or at least reducing the effects of one or more of the problems set forth above.

SUMMARY OF THE INVENTION

In accordance with one aspect of the invention there is provided a method in which a dual damascene metal interconnection is formed in the peripheral region using a material layer pattern. Preferably, the material layer pattern has a low reflection rate. In accordance with this method, also formed is a capacitor in the cell array region using the same material layer pattern.

More specifically, a first insulating layer is formed on a semiconductor substrate having the cell array region and the peripheral region. The material layer pattern is then formed on the first insulating layer. The material layer pattern has opening portions which define a contact hole for storage node in the cell array region and define a contact hole for metal interconnection in the peripheral region. The material layer pattern is made of a material that has an etching selectivity with respect to the first insulating layer and later-formed second insulating layer. For example, it may be made of a material selected from the group consisting of an undoped polysilicon, a nitride material, SiON and $Al_2O_3$.

A second insulating layer is formed on the material layer pattern. Groove photoresist pattern is Men formed on the second insulating layer and it has opening portions aligned over the opening portions defined by the material layer pattern. Using the photoresist pattern, the second is etched down to the material layer pattern to form a first opening. In success, exposed portion of the first insulating layer by the opening portions of material layer pattern is selectively etched to form a second opening self aligned to the first opening and thereby to form dual damascene opening in the peripheral region.

The dual damascene opening is then filled with a metal and planarized to form damascene metal interconnection to the semiconductor substrate.

The material layer pattern also is used for formation of storage node in the cell array region. After forming the damascene metal line in the peripheral region, a third insulating layer is formed on the entire surface of the semiconductor substrate. Another photoresist pattern is formed on the third insulating layer aligned over the opening portions of the material layer pattern and has opening portions which defines storage node. Using another photoresist pattern, third and second insulating layers are etched down to the material layer pattern to form a third opening. The exposed first insulating layer by the material layer pattern is then etched to form a fourth opening exposing desired portion of the semiconductor substrate. Conductive material is deposited in the third and fourth openings to form the storage node in the cell array region that is electrically connected to the desired portion of the semiconductor substrate.

Alternatively, process sequence can be reversed. Namely, after the storage node is formed in the cell array region, the dual damascene metal line can be formed in the peripheral region.

In accordance with another aspect of the invention, a semiconductor device is provided. The semiconductor device comprises a first insulating layer formed on a semiconductor substrate having a cell array region and a peripheral region. A material layer pattern formed on the first insulating layer, the material layer pattern having first opening portions at the cell array region and second opening portions at the peripheral region. a second insulating layer formed on the material layer pattern. A capacitor is formed in the second insulating layer and electrically connected to the semiconductor substrate through an opening in the first insulating layer that is self aligned with the first opening portions of the material layer pattern at the cell array region. Metal interconnections are formed in the second insulating layer and electrically connected to the semiconductor substrate through openings in the first insulating layer. The metal interconnections are self aligned with the second opening portions of the material layer pattern at the peripheral region.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Figure 1A:
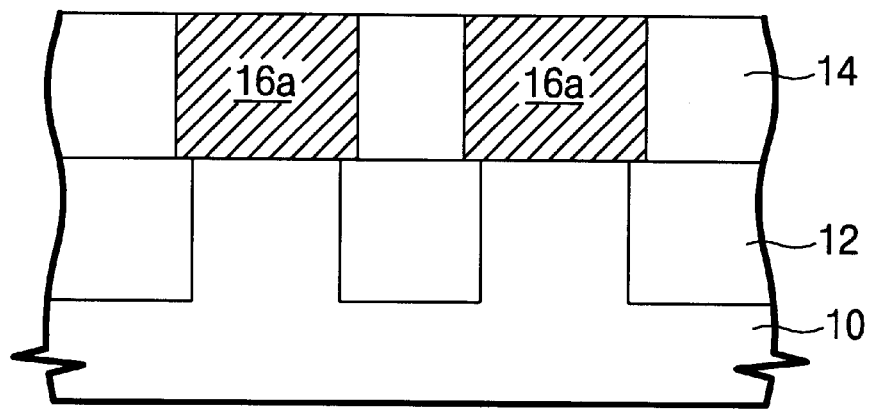
FIGS. 1A to 1F are cross-sectional views of a semiconductor substrate at selected process steps of fabricating a semiconductor memory device, taken along the word line direction, in accordance with the present invention.

Korean Patent Application No. 98-26585, filed on Jul. 2, 1998, is hereby incorporated by reference in its entirety as if fully set forth herein.

The present invention will now be described more fully hereinafter with reference to the accompanying drawings, in which preferred embodiments of the invention are shown. This invention may, however, be embodied in different forms and should not be construed as limited to the embodiments set forth herein.

In the drawings, the thickness of layers and regions are exaggerated for clarity. It will also be understood that when a layer is referred to as being "on" another layer or substrate, it can be directly on the other layer or substrate. or intervening layers may also be present. In contrast, when an element is referred to as being "directly on" another element, there are no intervening elements present. Moreover, each embodiment described and illustrated herein includes its complementary conductivity type embodiment as well.

The present invention relates to a method for fabricating a semiconductor memory device. FIGS. 1A to 1F show cross-sectional views of a semiconductor substrate at selected process steps of fabricating a semiconductor memory device, taken along a word line direction in a cell array region. FIGS. 2A to 2F show cross-sectional views of the semiconductor substrate, taken along a bit line direction in the cell array region. FIGS.3A to 3F show cross-sectional views of a peripheral region of the semiconductor substrate, taken along the word line direction. Identical elements in the drawings are identified with same reference numbers.

Figure 2A:
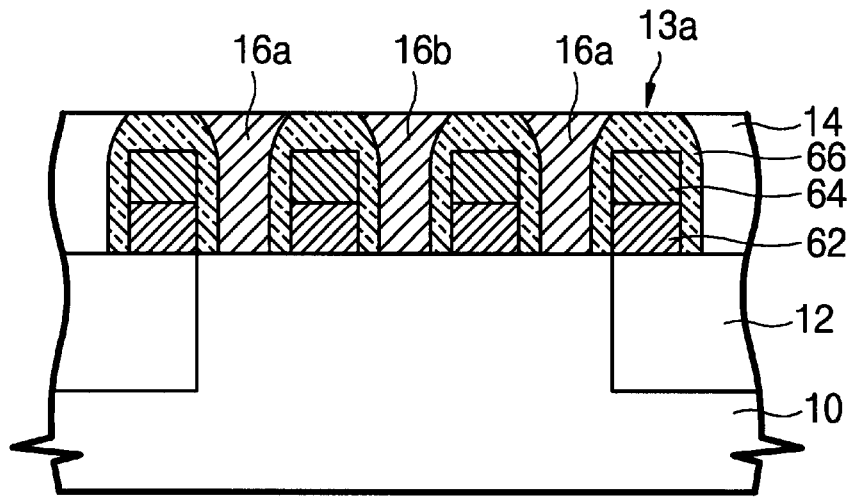
FIGS. 2A to 2F are cross-sectional views of a semiconductor substrate at selected process steps of fabricating a semiconductor memory device, taken along the bit line direction, in accordance with the present invention.
Figure 3A:
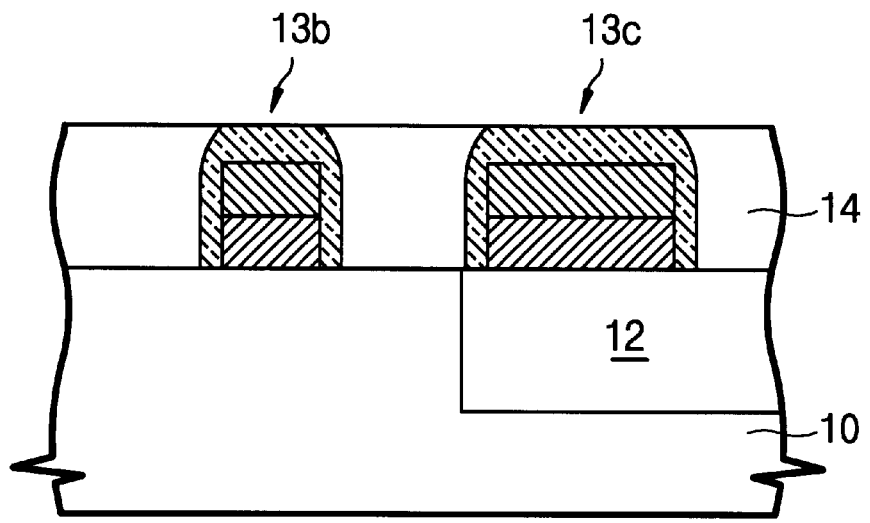
FIGS. 3A to 3F are cross-sectional views of a peripheral region of a semiconductor substrate at selected process steps of fabricating a semiconductor memory device, taken along the word line direction, in accordance with the present invention.

Referring now to FIGS. 1A, 2A and 3A, provided is a semiconductor substrate 10. As previously noted, FIG. 1A and 2A illustrates the cell array region while FIG. 3A illustrates the peripheral region. A device isolation layer 12 is formed on predetermined positions of the semiconductor substrate 10 to define active and inactive regions. As used herein, an active region is an area in the substrate to which electrical connection is to be made. The device isolation layer 12 surrounds active regions and electrically insulates each active region from adjacent active regions. The device isolation layer 12 may be formed by a shallow trench isolation technique or by a local oxidation of silicon technique. Transistors, including gate electrode layers 13a, 13b, 13c and source/drain regions (not shown are formed on active regions. Though not shown, gate insulating layers are formed between the active regions of the substrate 10 and the gate electrode layers 13a, 13b, 13c to electrically insulate the active regions from the gate electrode layers 13a, 13b, 13c. The gate electrode layers 13a, 13b, 13c may comprise a conductive layer and a protecting layer covering the conductive layer. The conductive layer of each gate electrode may comprise, for example, a polysilicon layer 62 and a metal silicide layer 64 to form a polycide structure. The gate protecting layer may comprise, for example, a silicon nitride layer 66.

In order to improve alignment margins, contact pads 16a and 16b are formed. More specifically, after formation of a transistor, a first insulator 14 is formed on the resulting structure. Selected portions of the first insulator 14 are etched to form openings which expose active regions between the gate electrodes. The openings are filled with a conductive material and planarized to form the contact pads 16a and 16b. Contact pads 16a are electrically connected to a later-formed storage node and contact pads 16b are electrically connected to later-formed bit lines.

Figure 1B:
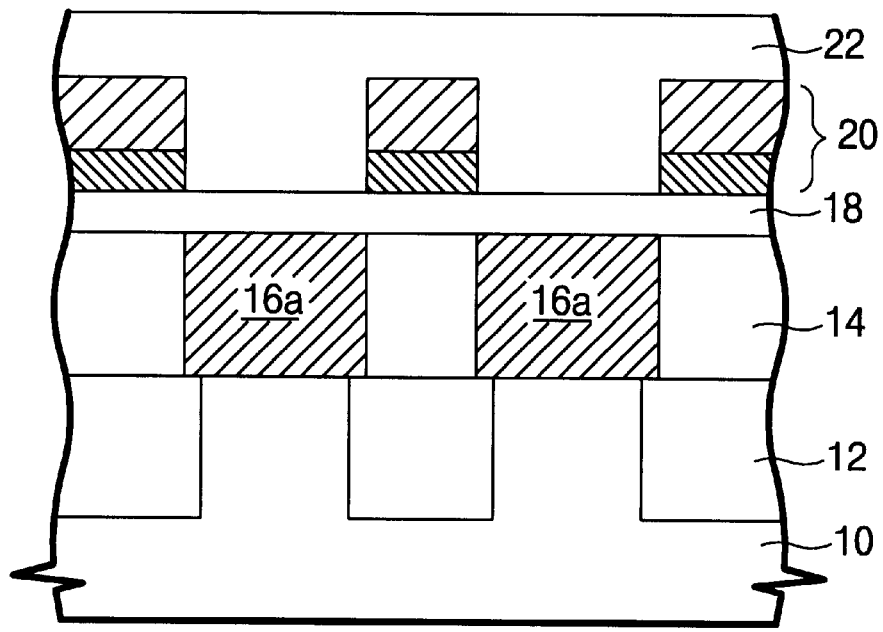
Figure 2B:
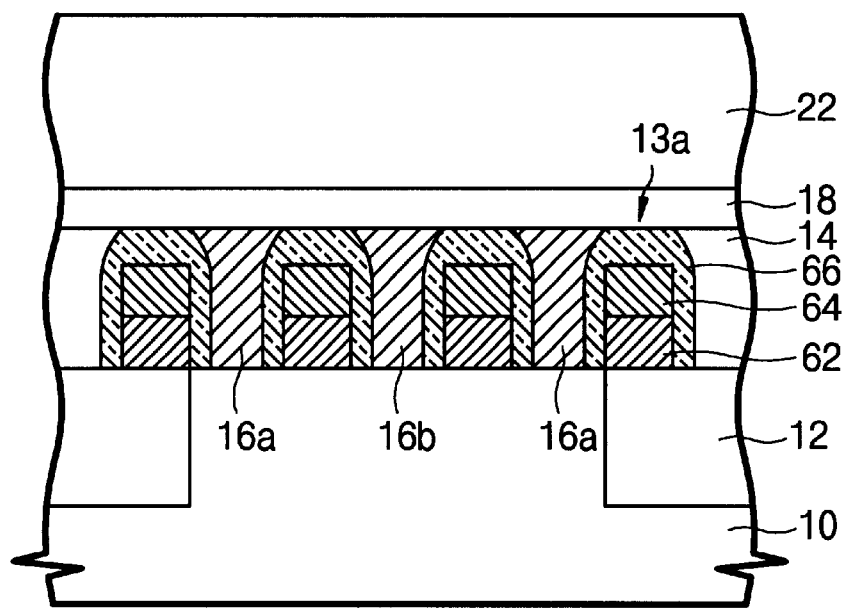
Figure 3B:
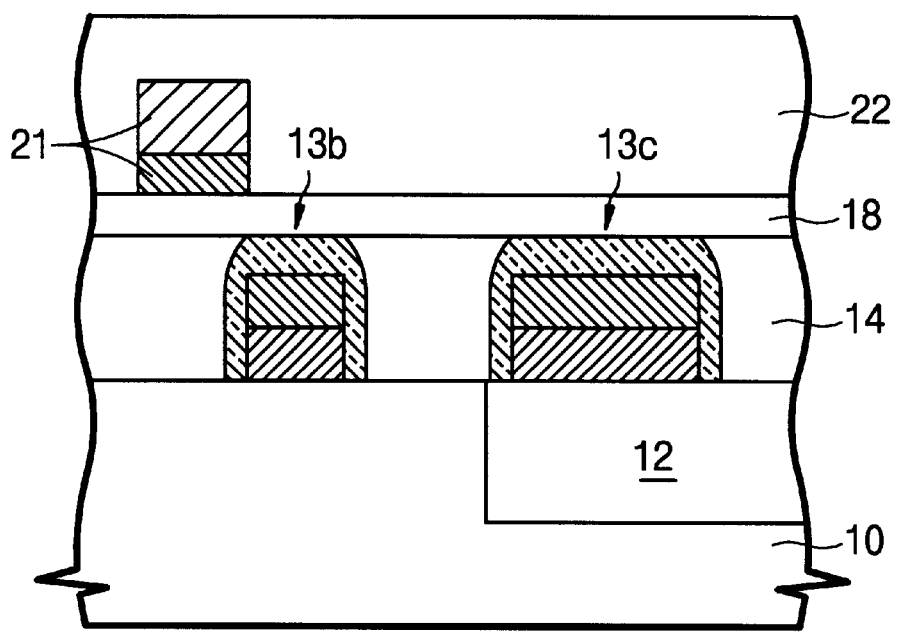

Referring now to FIGS. 1B, 2B and 3B, a second insulator 18, bit lines 20 and 21 and a first interlayer insulating layer 22 are formed on the first insulator 14 and the contact pads 16a and 16b, in accordance with conventional techniques known in the art. Though not shown in the drawings, the bit lines 20 and 21 are electrically connected to the contact pad 16b through a contact plug formed in the second insulator 18. The first interlayer insulating layer 22 is planarized to have a planar surface.

Figure 1C:
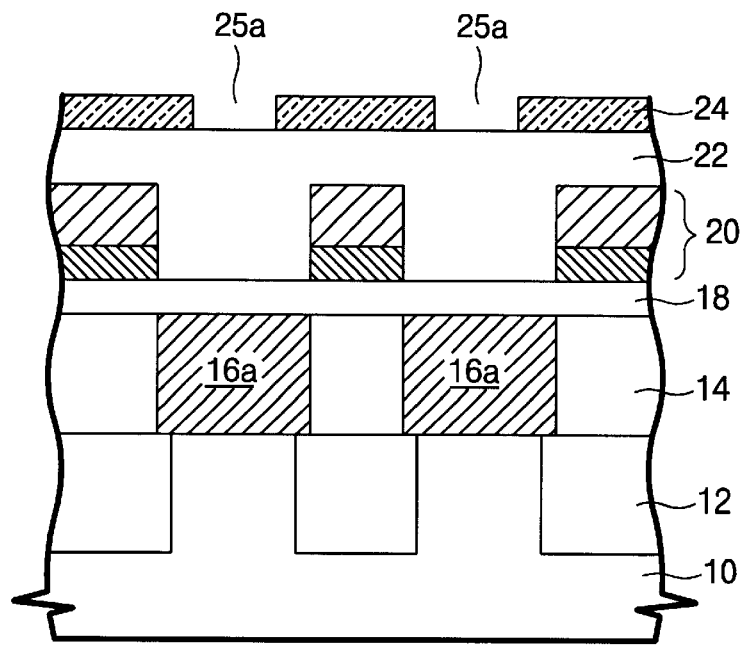
Figure 2C:
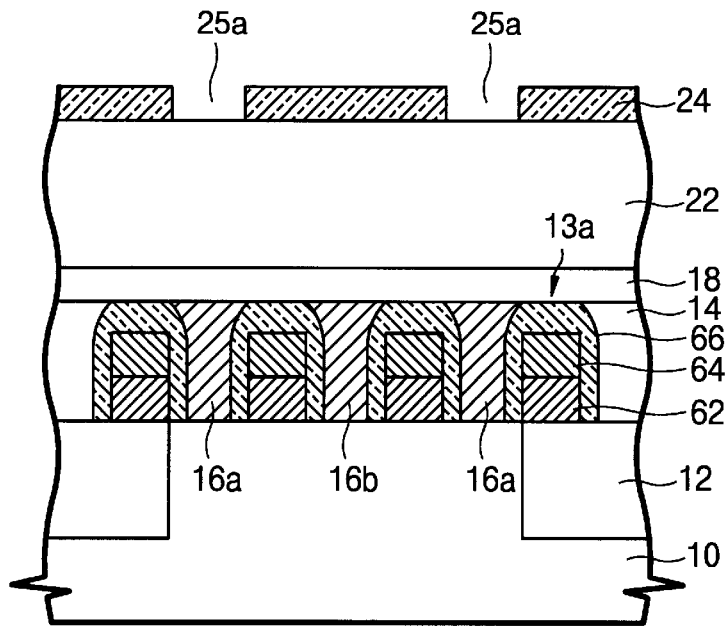
Figure 3C:
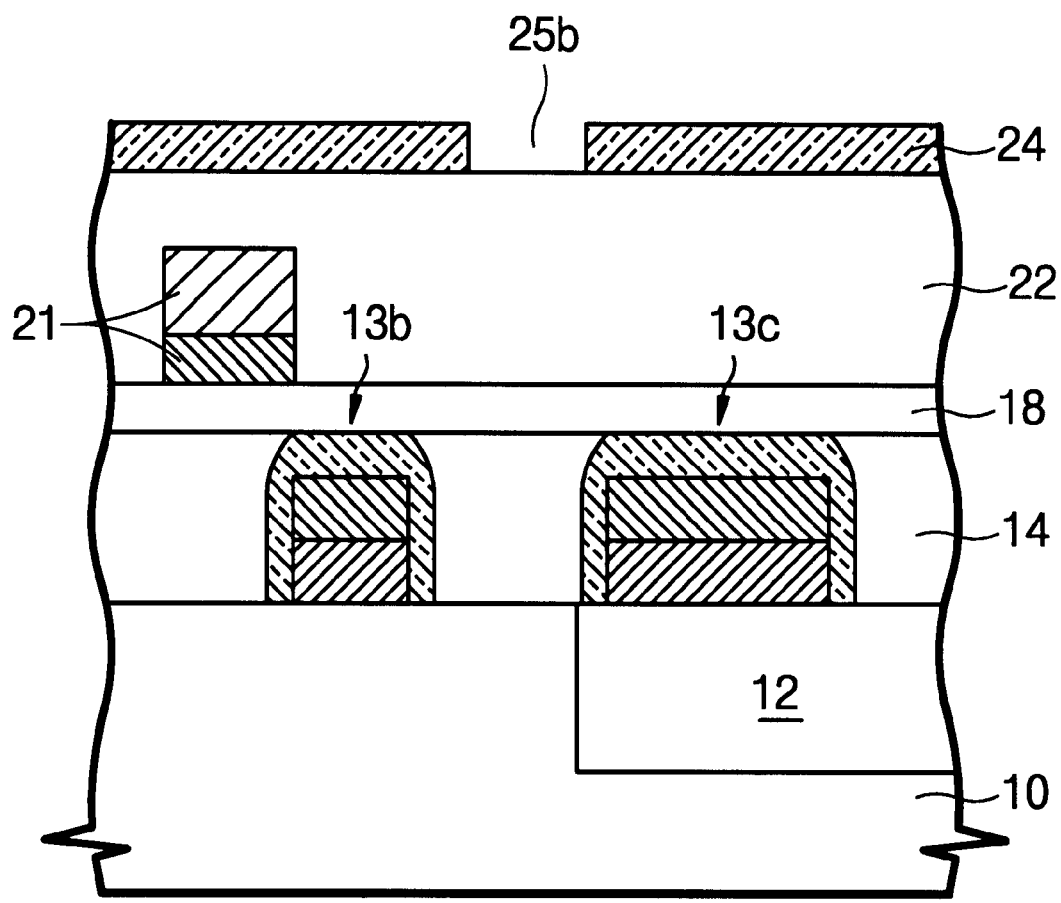

Referring now to FIGS. 1C, 2C and 3C, a material layer pattern 24 is formed on the first interlayer insulating layer 22 using conventional techniques known in the art. For example, the material layer pattern may comprise a photoresist layer. More specifically, after depositing material layer on the first interlayer insulating layer 22, a photo-mask is used to apply a the material layer pattern. An etching process is then carried out to form the material layer pattern 24. The material layer pattern 24 has first opening portions 25a (FIGS. 1C and 2C) and a second opening portion 25b (FIGS. 3C). The first opening portion 25a defines a first contact hole region for interconnection to a storage node in the cell array region. The second opening portion 25b defines a second contact hole region for interconnection in the peripheral region.

According to an aspect of the invention, the material layer pattern 24 is made of a material which has excellent etching selectivity, preferably at least 1:5 or more with respect to the insulators 14 and 18, the first interlayer insulating layer 22 and a later-formed second interlayer insulating layer 26. Preferably, the material layer pattern 24 has a very low reflection rate as compared to metal. The insulators 14 and 18 and interlayer insulating layers 22 and 26 are each preferably made of an oxide layer, and the material layer pattern 24 preferably is made of a material selected from the group consisting of an undoped polysilicon, a nitride material, SiON and $Al_2O_3$.

Figure 1D:
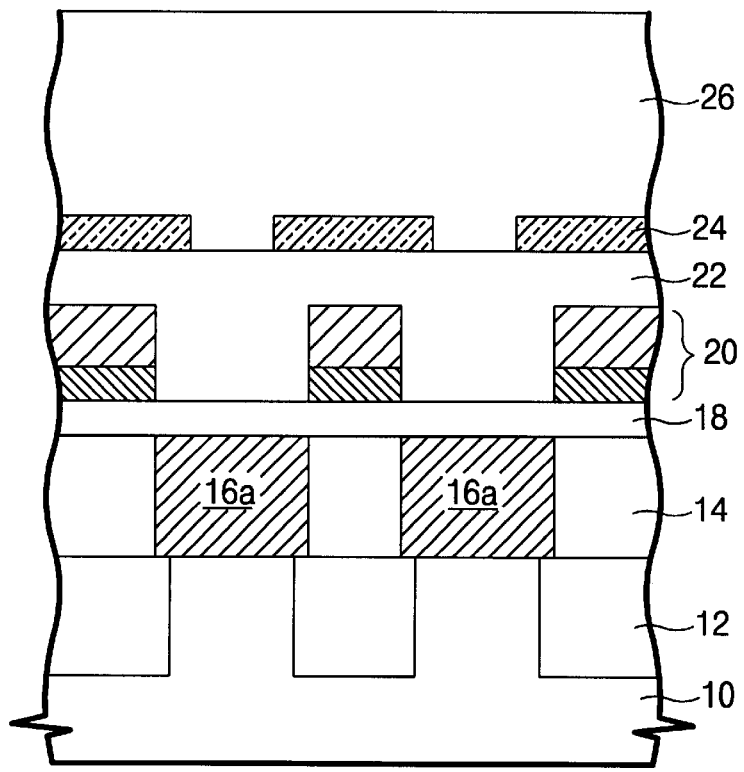
Figure 2D:
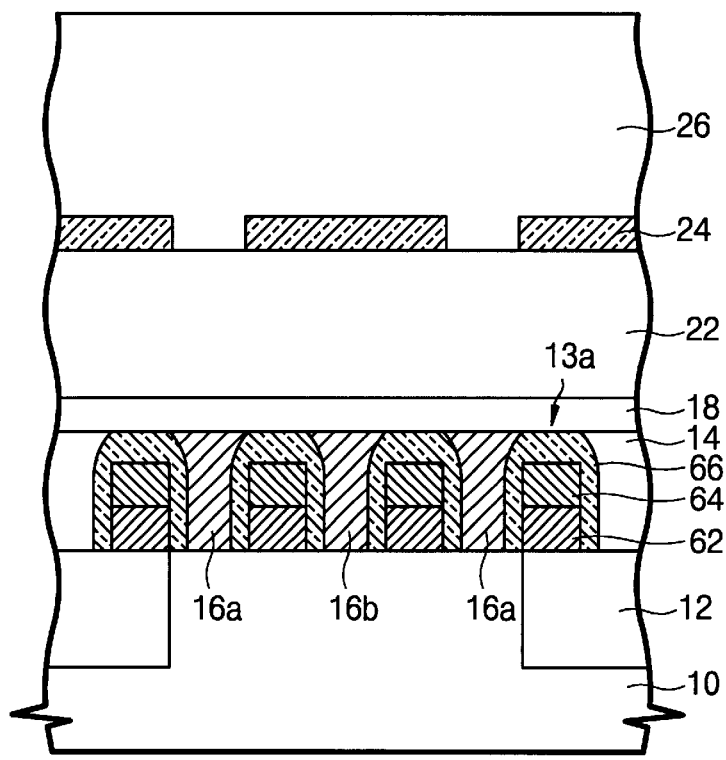
Figure 3D:
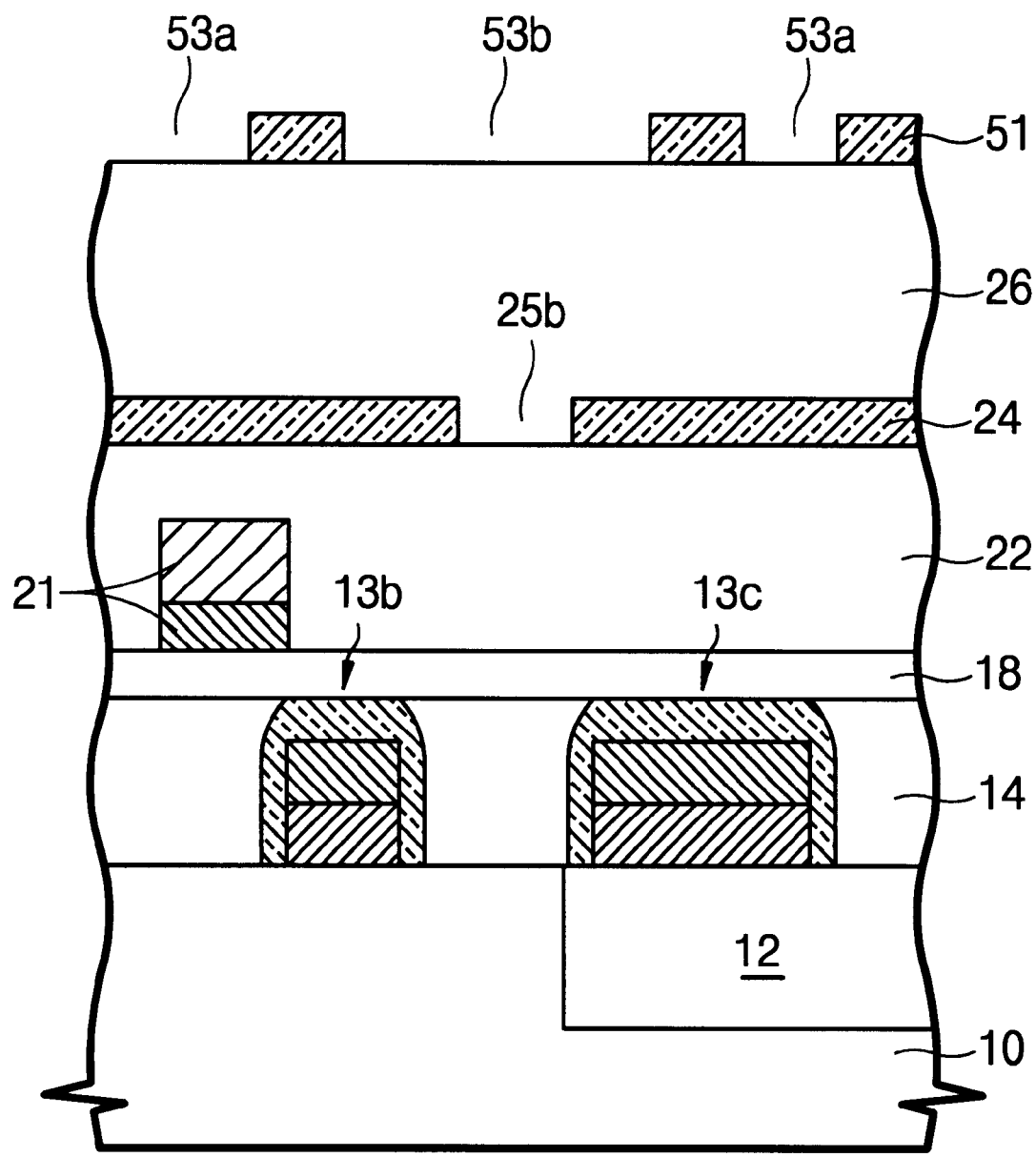

Referring now to FIG. 1D, 2D and 3D, a relatively thick second interlayer insulating layer 26 is formed on the first interlayer insulating layer 22. The second interlayer insulating layer 26 has a thickness of preferably about at least 0.4 microns, and more preferably, about 0.5 microns to 0.6 microns. The thickness of the second interlayer insulating layer 26 is determined based on the desired thickness of a later-formed metal line 28b (see FIG. 3E).

Figure 3E:
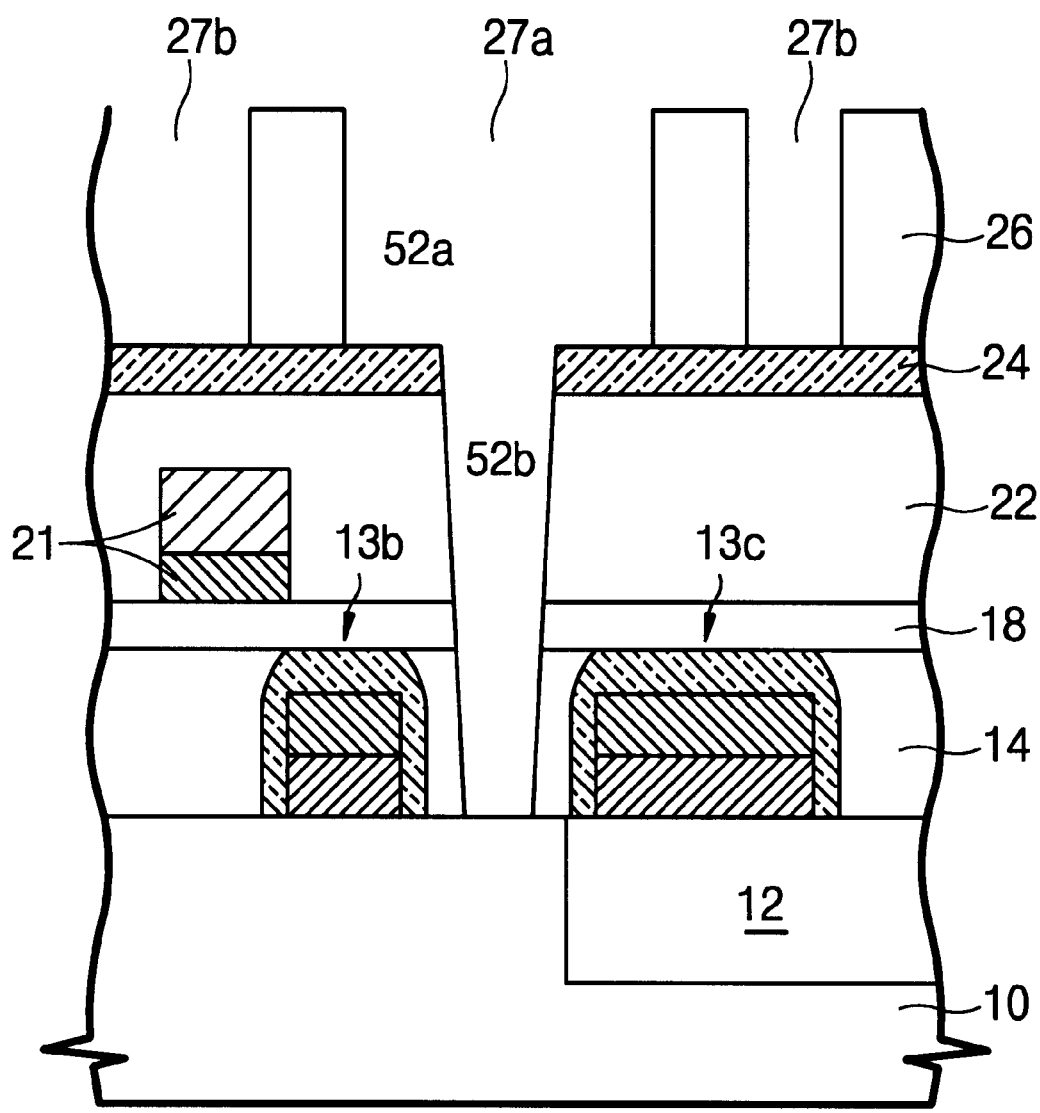
Figure 3F:
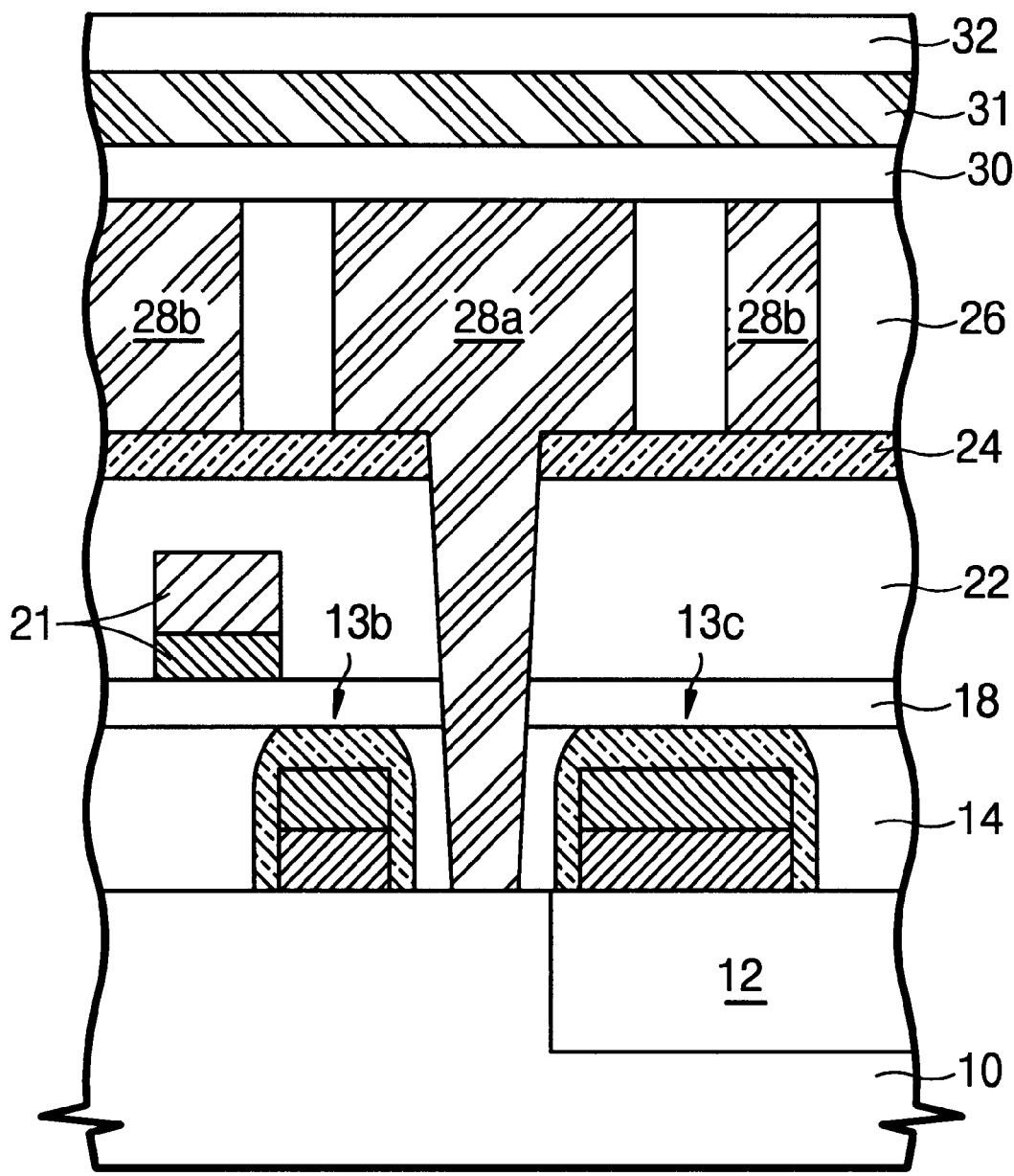

Formation of metal contacts and interconnections in the peripheral region is now described in reference to FIGS. 3D to 3F.

FIG. 3D shows exemplary portions of a groove mask pattern 51 that is formed on the second interlayer insulating layer 26. The groove mask pattern 51 may comprise a photoresist applied according to techniques known in the art. The groove mask pattern 51 includes opening portions 53a and 53b. Openings 53b are aligned over the second opening portion 25b of the material layer pattern 24. As shown, the opening portion 53b of the groove mask pattern 51 is larger than the second opening portion 25b of the material layer pattern 24.

Referring to FIG. 3E, the second interlayer insulating layer 26 is then etched to expose a portion of the material layer pattern 24 that includes the opening portion 25b of the material layer pattern 24, thereby forming the first contact openings 52a that extend to the surface of the material layer pattern 24. Using the exposed material layer pattern 24 as an etching mask, the exposed first interlayer insulating layer 22 and insulators 18 and 14 are etched to expose the active region of the semiconductor substrate 10 in the peripheral region, and the groove mask pattern 51 is removed. This forms second openings 52b in the peripheral region that extend from the material layer pattern 24 to an active region of the semiconductor substrate 10. As shown, openings 52b are self aligned with openings 52a and second opening portions 25b of the material layer pattern. FIG. 3E illustrates the resulting dual damascene openings 27a which encompasses openings 52a and 52b and extends from the second interlayer insulating layer 26 to the exposed active region of the substrate 10. Concurrently, the etching is stopped at the material layer pattern 24 to thereby form additional contact openings 27b in the second interlayer insulating layer that extend to the surface of the material layer pattern 24.

As shown in FIG. 3F, metal is then deposited in the openings 27a and 27b and planarized to form metal lines 28a and 28b which are buried in the second insulating layer 26. While not shown, other metal lines and contact plugs for interconnection between metal lines and the substrate can be simultaneously formed utilising the material layer pattern 24 by the same dual damascene technique as used to form metal line 28a. The used may be made of one selected from the group consisting of tungsten, titanium nitride, aluminum, tungsten nitride and copper.

As further shown in FIG. 3F, a third interlayer insulating layer 30 is deposited on the planarized surface of the metal lines 28a and 28b and the second insulating layer 26. Preferably, the overall thickness of the second interlayer insulating layer 26 and the third interlayer insulating layer 30 is about 1.0 microns to 1.2 microns. The overall thickness of the second and third interlayer insulating layers determines the height of the storage node in the cell array region. Subsequently, another metal line 31 and an insulator 32 are formed sequentially.

Formation of a capacitor in the cell array region is now described in reference to FIGS. 1E, 1F, 2E, and 2F. The capacitor is formed by a similar damascene technique as used to form metal lines 28a.

Figure 1E:
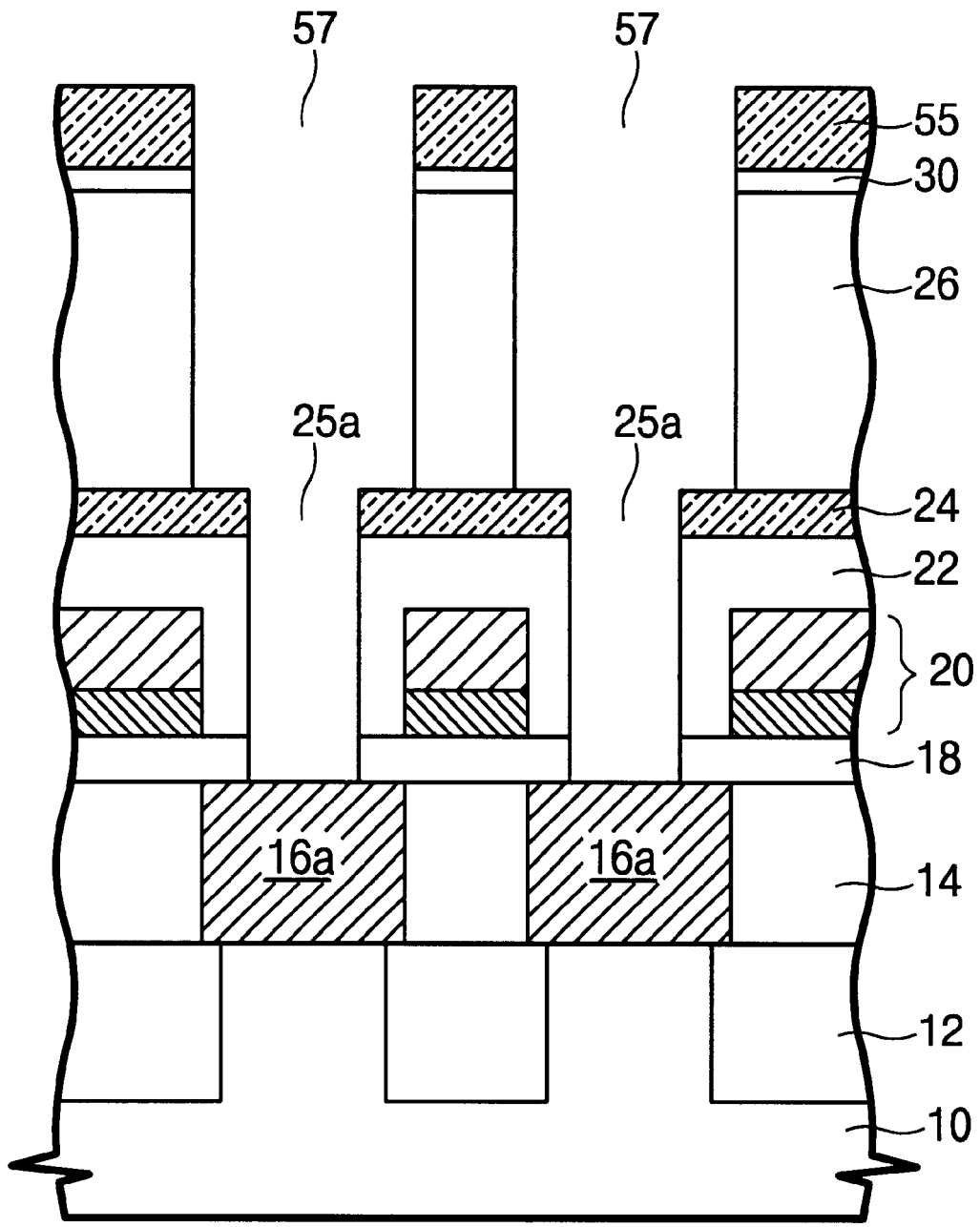
Figure 2E:
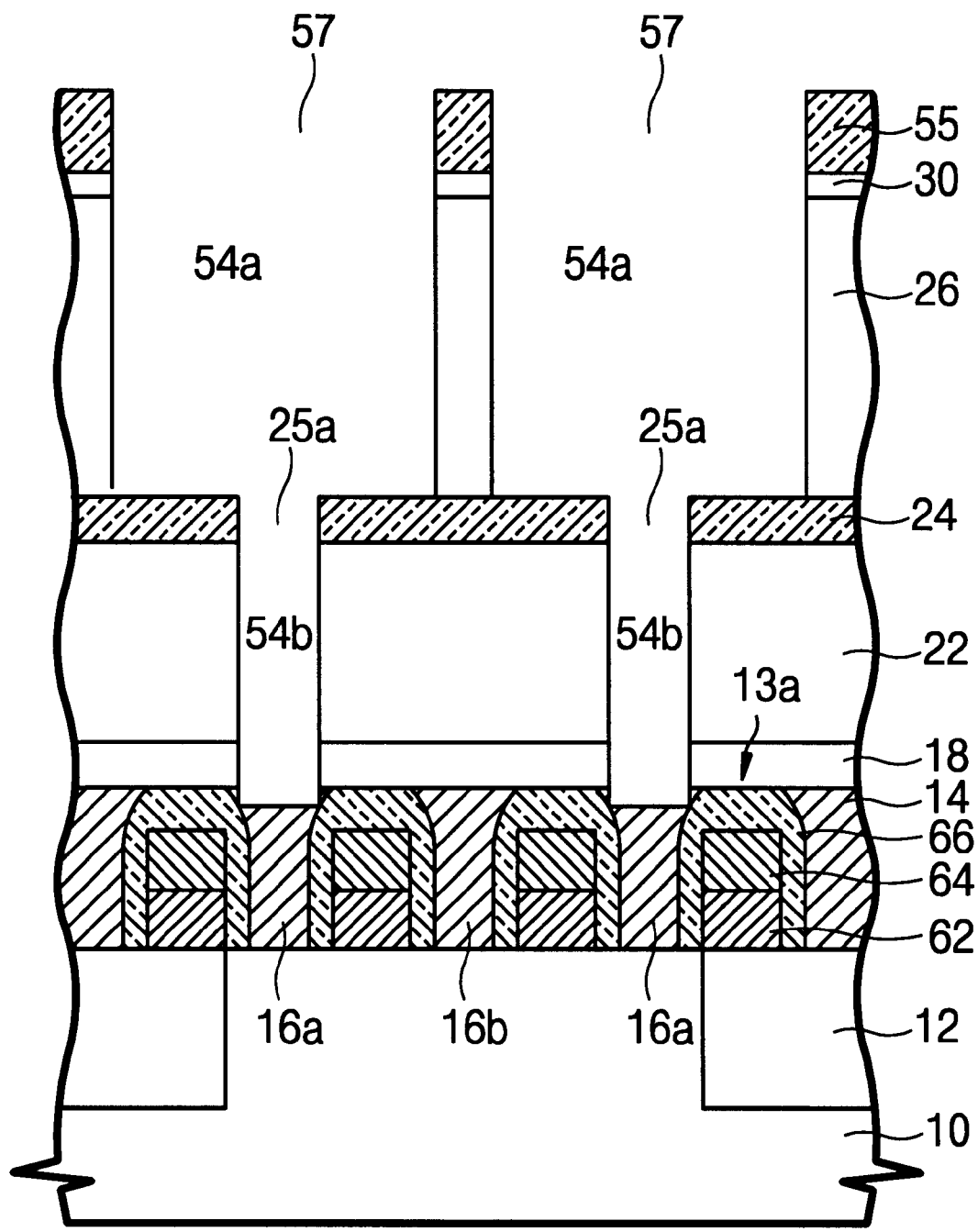

Referring to FIGS. 1E and 2E, a storage forming mask pattern 55 is formed over the third interlayer insulating layer 30. The storage forming mask pattern 55 includes opening portions 57 that are aligned over the first opening portions 25a of the material layer pattern 24. The opening portions 57 of the storage forming mask pattern 55 are larger than the first opening portions 25a of the material layer pattern 24. The second interlayer insulating layer 26 and the third interlayer insulating layer 30 are then etched to expose the material layer pattern 24 and first opening portions 25a, thereby forming first contact openings 54a in the cell array region that extend to the surface of the material layer pattern 24. Using the material layer pattern 24 as an etch stop, exposed second insulator 18 and first interlayer insulating layer 22 are also etched, thereby forming second openings 54b in the cell array region that extend from the material layer pattern 24 to the surface of contact pads 16a. These openings 54b are self aligned with openings 54a and the first opening portion 25a of the material layer pattern 24. The resulting damascene openings, shown generally as openings 57, are self aligned to the first openings 25a.

Figure 1F:
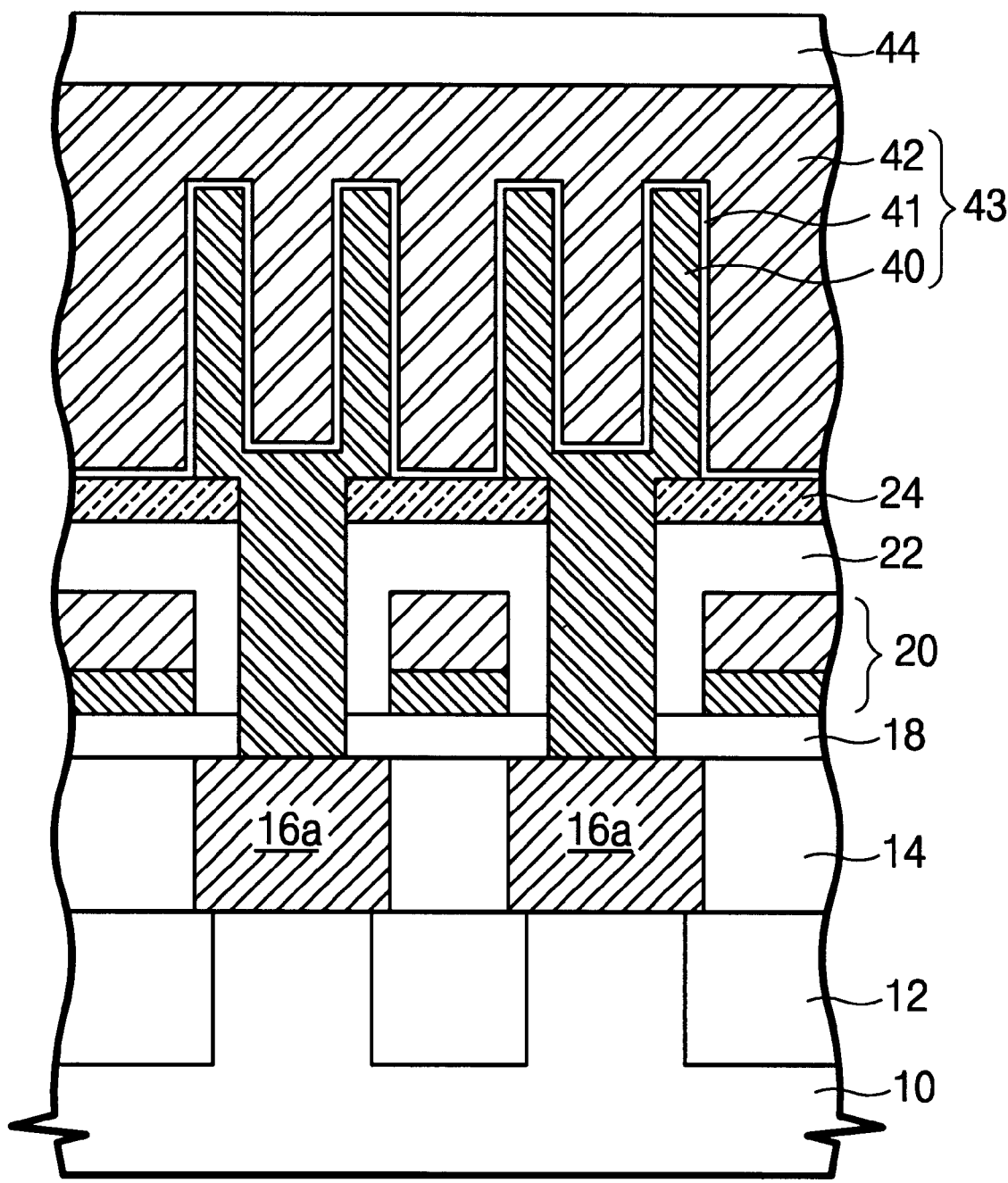
Figure 2F:
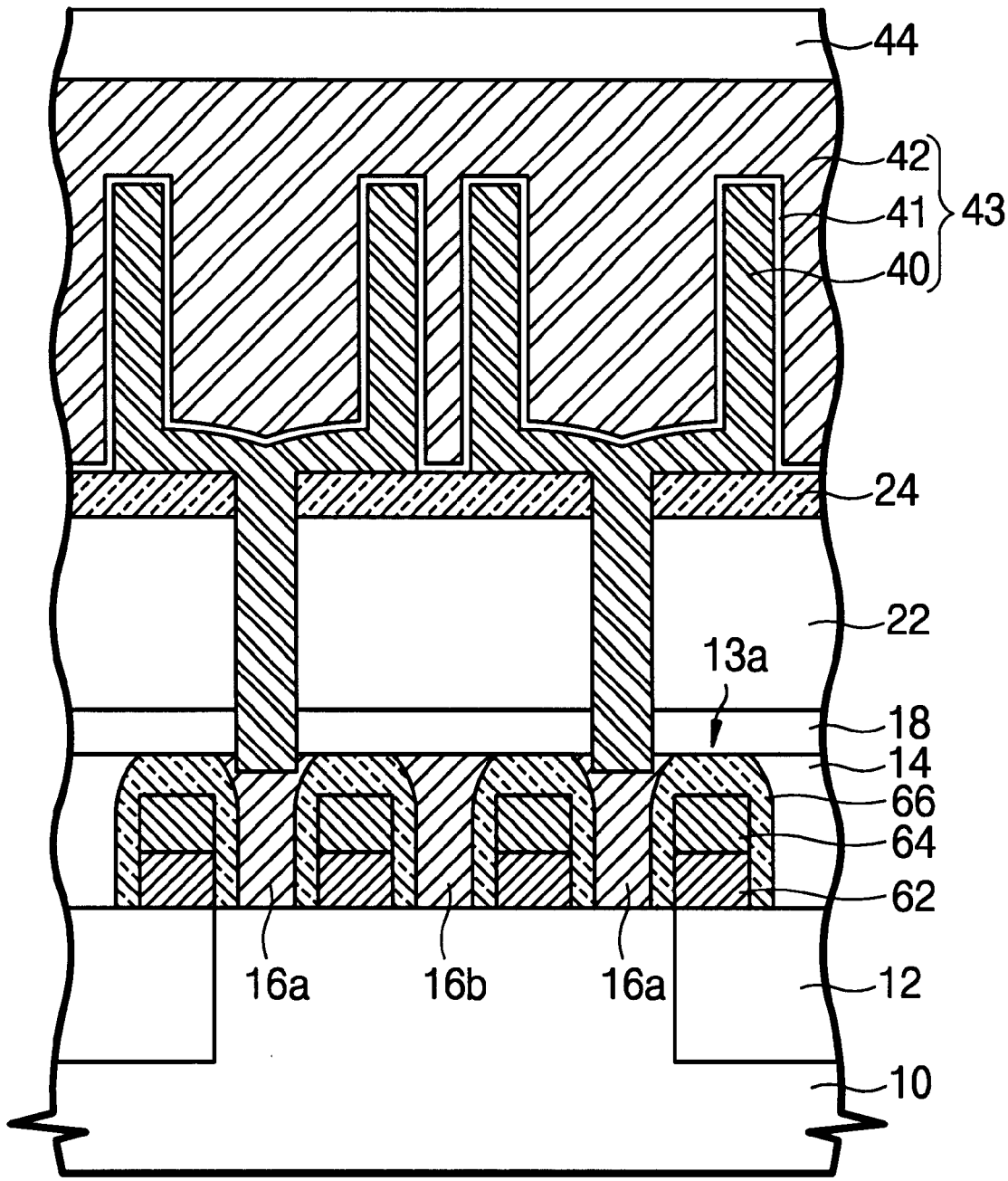

Referring to FIGS. 1F and 2F, conductive material is deposited in the openings 57 of the cell array region and planarized to form a storage node 40 which is connected to the contact pad 16a. Portions of the second interlayer insulating layer 26 and third interlayer insulating layer 30 that are outside of the storage node 40 are removed, and a dielectric layer 41 and a plate node 42 are deposited to form a cylindrical capacitor. Alternatively, a box type capacitor may also be formed by completely filling the openings of the storage node.

Alternatively, formation of the metal interconnections of the peripheral region and formation of the capacitors of the cell array region can be reversed. In such an embodiment, a capacitor is formed in the cell array region first, and then metal interconnection is formed in the peripheral region. After the capacitor is formed in the cell array region by a damascene technique, an insulator 44 is deposited thereon. Next, in the peripheral region, first interlayer insulating layer 22, second interlayer insulating layer 26, first insulator 14 and second insulator 18 are etched to form a dual damascene opening 27a and opening 27b (see FIG. 3E). The openings 27a and 27b are filled with a metal to form dual damascene metal line 28a and metal line 28b. The metal line 28b may be used as a dummy pattern. Subsequently, the third insulating layer 30, metal line 31 and insulating layer 32 are formed.

The material layer pattern 24 is used for both the formation of a capacitor and the formation of metal interconnection in the damascene process.

Thus, a process for fabricating a semiconductor memory device has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method for fabricating a semiconductor device comprising:

forming a device isolation region on a semiconductor substrate to define an active region, the semiconductor substrate having a cell array region and a peripheral region;

forming a first interlayer insulating layer on the substrate;

forming a material layer pattern on the first interlayer insulating layer, the material layer pattern having a first opening portion defining a first contact hole for a storage node at the cell array region and a second opening portion defining a second contact hole for a metal interconnection at the peripheral region;

forming a second interlayer insulating layer on the material layer pattern;

forming a groove mask pattern on the second interlayer insulating layer, the groove mask pattern having an opening portion aligned over at least the second opening portion of the material layer pattern at the peripheral region, the opening portion of the groove mask pattern being larger than the second opening portion of the material layer pattern;

using the groove mask pattern and the material layer pattern as etch stops, etching exposed portions of the second interlayer insulating layer and the first interlayer insulating layer to form interconnection openings in the peripheral region, the interconnection openings being self aligned with the second opening portions of the material layer pattern; and filling the interconnection openings in the peripheral region with a conductive material to form a metal interconnection.

2. The method according to claim 1, wherein the material layer pattern has an etching selectivity with respect to the first and second interlayer insulating layers.

3. The method according to claim 2, wherein the material layer pattern has an etching selectivity ratio of at least 1:5 with respect to the first and second interlayer insulating layers.

4. The method according to claim 1, wherein the material layer pattern is made of a material selected from the group consisting of an undoped polysilicon, a nitride material, SiON and $Al_2O_3$.

5. The method according to claim 1, wherein the second interlayer insulating layer has a thickness of at least 0.4 microns.

6. The method according to claim 1, wherein the conductive material is made of a material selected from the group consisting of tungsten, titanium nitride, aluminum, tungsten nitride and copper.

7. The method according to claim 1, further comprising:

forming a storage node mask pattern having opening portions that are over the first opening portions at the cell array region, the opening portions of the storage node mask pattern being larger than the first opening portions of the material layer pattern;

using the storage node mask pattern and the material layer pattern as etch stops, etching exposed portions of the second interlayer insulating layer to form openings in the cell array region that are self aligned with the first opening portions of the material layer pattern.

8. The method according to claim 7, further comprising filling the opening portions in the cell array region with a conductive material.

9. The method according to claim 8, further comprising forming at least one capacitor in the opening portions in the cell array region.

10. The method according to claim 1, wherein etching exposed portions of the second interlayer insulating layer comprises:

etching the second interlayer insulating layer to form first openings in the peripheral region that extend to the surface of the material layer pattern;

etching portions of the first interlayer insulating layer exposed by the second opening portions of the material layer pattern to form second openings in the peripheral region that extend to active regions of the semiconductor substrate, the second openings in the peripheral region being self aligned with first openings in the peripheral region;

wherein first and second openings in the peripheral region define the interconnection openings.

11. The method according to claim 10, wherein some of the first openings in the peripheral region extend only to the surface of the material layer pattern and form contact openings.

12. The method according to claim 11, wherein filling interconnection openings in the peripheral region includes filling the first openings in the peripheral region that extend only to the surface of the material layer pattern, thereby forming metal contacts.

13. The method according to claim 1, wherein filling interconnection openings in the peripheral region includes filling the interconnection openings with the conductive material and planarizing the resulting structure.

14. A method for fabricating a semiconductor device, the method comprising the steps of:

forming a device isolation region on a semiconductor substrate to define an active region, the semiconductor substrate having a cell array region and a peripheral region;

forming a first interlayer insulating layer on the substrate;

forming a material layer pattern on the first interlayer insulating layer, the material layer pattern having first opening portions to define contact holes for storage nodes at the cell array region and second opening portions to define contact holes for metal interconnections at the peripheral region respectively;

forming a second interlayer insulating layer on the material layer pattern;

forming a storage node mask pattern on the material layer pattern, the storage node mask pattern having opening portions aligned over the first opening portions at the cell array region;

using the storage node mask pattern and etching the second interlayer insulating layer and stopping at the material layer pattern to form first contact openings in the cell array region, and etching exposed portions of the first interlayer insulating layer within the first contact openings in the cell array region to form second contact openings self aligned to the first contact openings;

forming a storage node comprised of a first conductive layer, a dielectric layer and a second conductive layer in the first and second contact openings;

forming a third interlayer insulating layer;

forming a groove mask pattern on the third interlayer insulating layer, the groove mask pattern having opening portions at the peripheral region that are aligned over the second opening portions of the material layer pattern;

using the groove mask as an etching mask and etching the third interlayer insulting layer and stopping at the material layer pattern to form first contact openings in the peripheral region, and etching exposed portions of the first interlayer insulating layer to form second contact openings in the peripheral region that are self aligned to the second opening portions of the material layer pattern; and filling the first and second contact openings in the peripheral region with a conductive material to form metal interconnections therein.

15. The method according to claim 14, wherein the material layer pattern has an etching selectivity with respect to the first and second interlayer insulating layers.

16. The method according to claim 15, wherein the material layer pattern has an etching selectivity ratio of at least 1:5 with respect to the first and second interlayer insulating layers.

17. The method according to claim 14, wherein the material layer pattern is made of a material selected from the group consisting of an undoped polysilicon, a nitride material, SiON and $Al_2O_3$.

18. The method according to claim 14, wherein the third interlayer insulating layer has a thickness of at least 0.4 microns.

19. The method according to claim 14, wherein the conductive material is made of a material selected from the group consisting of tungsten, titanium nitride, aluminum, tungsten nitride and copper.

20. The method according to claim 14, wherein some of the first openings in the peripheral region extend only to the surface of the material layer pattern and form contact openings.

21. The method according to claim 20, wherein filling the first and second contact openings in the peripheral region includes filling the first openings in the peripheral region that extend only to the surface of the material layer pattern, thereby forming metal contacts.

22. The method according to claim 14, wherein filling first and second contact openings in the peripheral region includes filling the first and second contact openings with the conductive material and planarizing the resulting structure.

* * * * *